United States Patent [19]

Berg

[11] Patent Number: 5,377,404
[45] Date of Patent: Jan. 3, 1995

[54] METHOD FOR FABRICATING A MULTI-LAYER PRINTED CIRCUIT BOARD

[76] Inventor: N. Edward Berg, 43 Smith Rd., Bedford, N.H. 03110

[21] Appl. No.: 166,166

[22] Filed: Dec. 10, 1993

Related U.S. Application Data

[63] Continuation of Ser. No. 953,472, Sep. 29, 1992, abandoned.

[51] Int. Cl.⁶ .......................... H05K 3/36; B23P 21/00
[52] U.S. Cl. ........................................ 29/830; 29/703;
29/846; 29/DIG. 12; 408/704
[58] Field of Search ............... 29/26 A, 703, 720, 825,
29/829, 830, 833, 846, DIG. 12; 156/233, 273.3;
346/108; 408/3, 1 R, 16, 230, 704;
430/270-273, 314

[56] References Cited

U.S. PATENT DOCUMENTS

| | | | |
|---|---|---|---|
| 5,111,4606 | 5/1992 | Zachman et al. | 408/16 X |
| 3,696,504 | 10/1972 | Cupler, II | 408/704 X |
| 3,945,827 | 3/1976 | Brown | 430/314 |
| 4,176,281 | 11/1979 | Tischer et al. | 250/492 |
| 4,424,519 | 1/1984 | Neumann et al. | 346/108 |
| 4,479,145 | 10/1984 | Azuma et al. | 358/106 |
| 4,504,727 | 3/1985 | Melcher et al. | 219/121 |
| 4,639,868 | 1/1987 | Tanaka et al. | 364/420 |
| 4,639,878 | 1/1987 | Day et al. | 364/513 |
| 4,641,352 | 2/1987 | Fenster et al. | 382/6 |
| 4,668,601 | 5/1987 | Kistner | 430/273 X |
| 4,722,644 | 2/1988 | Scheuch | 408/704 X |
| 4,790,694 | 12/1988 | Wilent et al. | 408/3 X |
| 4,815,000 | 3/1989 | Yoneda et al. | 364/474.34 |
| 4,930,890 | 6/1990 | Hara et al. | 356/241 |
| 4,943,334 | 7/1990 | Medney et al. | 156/233 X |
| 5,005,135 | 4/1991 | Morser et al. | 364/474.35 |
| 5,007,006 | 4/1991 | Taylor et al. | 364/571.05 |

FOREIGN PATENT DOCUMENTS 306111 12/1989 Japan .................................. 408/704

*Primary Examiner*—Peter Dungba Vo
*Attorney, Agent, or Firm*—Hayes, Soloway, Hennessey, Grossman & Hage

[57] ABSTRACT

A method for fabricating at least one via or hole in a multi-layer printed circuit board comprises separately drilling the board layers, stacking and laminating the drilled board layers utilizing conformal mapping digital imaging in a computer, and then finish drilling the holes. The invention also provides a method for correcting artwork to compensate for lamination distortion.

11 Claims, 1 Drawing Sheet

METHOD FOR FABRICATING A MULTI-LAYER PRINTED CIRCUIT BOARD

This is a continuation of copending application Ser. No. 07/953,472 filed on Sep. 29, 1992 now abandoned.

FIELD OF THE INVENTION

The present invention relates generally to a method for fabricating a printed circuit board. The present invention has particular utility in the fabricating of multi-layer printed circuit boards having at least one via or through-hole, and will be described in connection with such utility, although other utilities are contemplated.

BACKGROUND OF THE INVENTION

Multi-layer printed circuit boards have found increasing use in the manufacture of electronic products. A typical multi-layer circuit board comprises a plurality of individual circuit boards laminated together. Each printed circuit board comprises an electrically non-conductive substrate material having conductive patterns formed on one or both sides thereof. The conductive patterns provide interconnect paths among the active and passive electronic components mounted on the board. In order to afford proper connections, predetermined points on the conductive paths on different individual boards must be interconnected, and these interconnections are typically made by drilling holes through the board at precise locations, followed by plating the through-holes with an electrically conductive material. Since a typical multi-layer board may have a large number of holes, the drilling typically is accomplished using a computer controlled automatic drilling apparatus. A typical drilling apparatus used for this purpose has multiple drill spindles which are independently activated by the master program in order to reduce the total drilling time required to form the multiple holes on a single multi-layer board. In order to properly position the multi-layer board initially in the drilling apparatus, some fixed referencing arrangement is usually employed, such as registration holes formed in edge portions of the board which mate with pins carried by the drilling apparatus table.

A problem encountered in the multi-layer board fabrication art is that of misregistration among the individual boards comprising the assembly. While the individual board patterns can be formed very precisely using conventional photolithography, exact registration among the multiple patterns on the several boards is impossible to achieve due to distortions introduced during the lamination processing. These distortions typically lead to maximum misregistration at the outer edges of the panels. The principal criterion for a useful board can be simply stated: each hole drilled through the multi-layer board must be surrounded by a conductive material at each layer in order to form a useful hole. Due, however, to the misregistration introduced during the lamination process, this criterion cannot be met by all multi-layer boards. In fact, the rejection rate for multi-layer boards has a present practical range of from 5% to 20%, depending upon the minimum pattern line width, maximum acceptable hole diameter, pattern complexity, and number of layers.

In the past, attempts at quality control for multi-layer circuit boards have centered about an inspection process wherein the developing multi-layer board is photographed at preselected stages of the fabrication process using an x-radiation sensitive film and an x-radiation source. After the films are developed, the successive photographs are compared to discern the degree of misregistration or distortion introduced during the intervening steps between the preselected stages. Once final multi-layer assembly is completed, and before the board is subjected to programmed drilling, a final comparison is made and the board is either accepted or rejected for drilling based upon this final comparison. Although useful, this process is slow and cumbersome and can only effectively be employed to sample representative multi-layer boards with theoretically identical patterns, which are undergoing multi-layer lamination. Since this technique is only amenable to spot sampling in a production environment, many multi-layer boards which should be rejected for misregistration or deformation may be passed on to the automatic drilling station, where they are uselessly drilled and ultimately scrapped. The automated drilling of a board which does not meet the minimum registration requirements is wasteful, since it results in a product which cannot be used. With relatively dense boards, thousands of holes may be drilled, which consumes relatively large periods of the drilling machine time. For example, in an 18 inch×24 inch multi-layer board, the number of holes typically ranges from 12,000 to 14,000, and the complete drilling of such a board can take as long as 90 minutes. As a result, the x-radiation source/x-radiation sensitive film inspection process has not been found to be a satisfactory solution to the problem of effective quality control for multi-layer boards prior to drilling.

In an effort to avoid the disadvantages with the x-radiation source/x-radiation sensitive film inspection process, a system has been developed to permit on-line inspection of multi-layer boards using an x-ray imaging system which examines test holes formed near the corners of the individual board layers and displays the percent of registration among all corresponding holes in a given corner region. While useful, this system is very large and expensive, and merely provides a percent registration figure for each set of test holes on a sequential basis. If a given multi-layer board falls within the permitted percentage of misregistration, it will be passed on for drilling. For those accepted boards which are close to the maximum permitted misregistration, the accumulation of tolerance errors inherent in the drilling machine can result in a multi-layer board with unacceptable through-holes.

The foregoing discussion of the prior art is taken largely from U.S. Pat. No. 4,790,694 to Wilent et al who propose registering a multi-layer printed circuit board prior to drilling by positioning the multi-layer board in an inspection fixture, examining a plurality of target areas located at predetermined locations on the multi-layer board with a radiation source and a detector, comparing the locations of the target areas with predetermined location coordinates, and marking the multi-layer board with reference indicia to provide proper positioning of the multi-layer board during drilling. Preferably, according to Wilent et al, the comparison is performed using predetermined location coordinates obtained by centering a master template having the target areas in the inspection fixture, and storing the location coordinates of the master template target areas. Further preferably, the marking step includes the formation of apertures along one edge portion of the multi-layer board.

While Wilent et al is believed to overcome certain of the deficiencies of the prior art as above discussed, Wilent et al employs relatively slow electromechanical servo-motors to move the master template in conjunction with another electromechanical device, the marking mechanism, which slows the process considerably. Moreover, the template itself is subject to warping, misalignment, and design tolerance errors. Finally, marking the multi-layer board with reference indicia in the form of apertures may result in connection lines being inadvertently commoned, shorted, or otherwise compromised.

Other problems common to multi-layer drilling systems include drilling inaccuracies due to drill bit wear and chipping, drill bit warding due to bit overheating, drill smear and machine down-time and rework costs due to drill bit breakage.

It is an object of the present invention to provide a novel method for fabricating a through-hole in a multi-layer printed circuit board which overcomes the aforesaid and other deficiencies of the prior art. More specific objects are to provide a novel multi-layer board registration and drilling method. Yet another object of the present invention is to provide a fabrication method that increases the quality of drilled through-holes and substantially decreases drill bit wear.

SUMMARY OF THE INVENTION

The present invention in one aspect provides a method for fabricating a through-hole in a multi-layer printed circuit board by separately drilling each layer. Undersized through-holes are formed in predetermined positions in each layer. The separate boards are then stacked and laminated to one another, and the through-holes are then dressed out to finish size. In a preferred embodiment of the invention exact hole positions of developing multi-layer boards are sensed, and adjustments made in imaging subsequent boards.

BRIEF DESCRIPTION OF THE DRAWINGS

For a further understanding of the nature and advantages of the present invention, reference should be made to the following Detailed Description, taken in conjunction with the accompanying drawings, where like numerals represent like elements, and wherein.

DETAILED DESCRIPTION OF THE INVENTION

Figure 1:
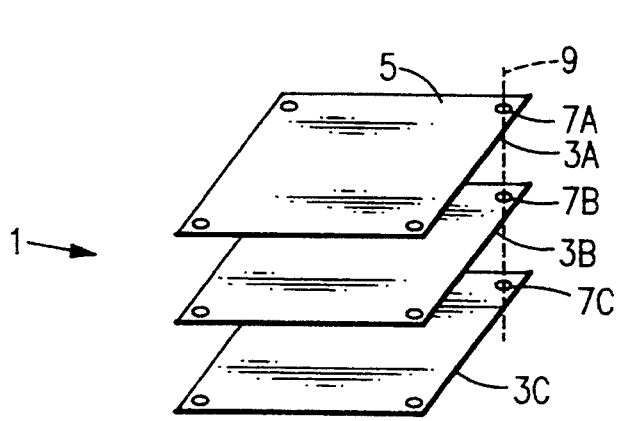
FIG. 1 depicts a side elevational-exploded view of a multi-layer printed circuit board, and showing its through-hole construction.

FIG. 1 depicts an exploded view of a multi-layer printed circuit board showing typical through-hole construction. A typical multi-layer printed circuit board, generally referred to as 1, comprises a plurality of separate boards 3a, 3b and 3c each having a variety of conductive patterns or lines 5 disposed upon them, and one or more through-holes 9 comprised of separate holes 7a, 7b and 7c formed respectively in boards 3a, 3b and 3c. It should be understood at the outset, that although FIG. 1 depicts a multi-layer circuit board comprising three separate boards the present invention may be used in fabricating a through-hole in a multi-layer circuit board comprising any number of separate layers.

Figure 2:
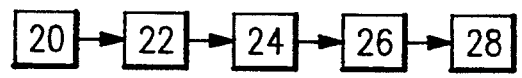
FIG. 2 is a schematic block diagram of a typical prior art method for forming a through-hole in a multi-layer printed circuit board.

FIG. 2 is a schematic block diagram of a typical prior art method of forming a through-hole in a multi-layer board. Such prior art method typically comprises forming the separate board layers in known manner at a lithography station 20, registering the separate boards, and laminating the stacked boards at a laminating station 22, and forming a through-hole through all of the stacked boards at once, e.g. by drilling at a drilling station 24. Drilling typically is then followed by cleaning and desmearing at a cleaning station 26, and the cleaned and desmeared holes are then plated through at a plating station 28.

Figure 3:
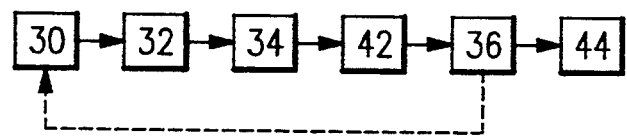
FIG. 3 is a schematic block diagram of a preferred embodiment of the present invention.

Referring to FIG. 3, in accordance with the present invention a first board layer is imaged at an imaging station 30. The imaged board is then processed at a processing station 32 where the conductive patterns are formed, and the processed board is then passed to a drilling station 34 which preferably comprises a multi-spindle drilling automatic drilling machine. Alternatively, drilling station 34 may comprise a punch, a laser drill or other hole-making device. The holes formed at drilling station 34 preferably are undersized by design, i.e. typically 50 to 75% of the desired finish hole size. Making the holes initially smaller than the desired finish hole size has the advantage of reducing wear on the larger drill bits, and coupled with a finish drilling step may produce a neater/cleaning final hole. However, it is not necessary to make the holes initially smaller than the desired finish hole size.

Figure 4:
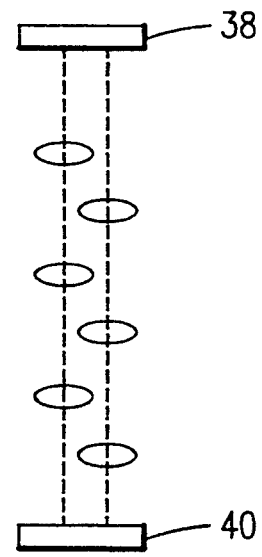
FIG. 4 is a perspective view of a circuit board layer at an interim stage in the process of the present invention.

The board, following drilling, is then passed to a stacking and laminating station 42 where a plurality of boards are laminated together to produce a developing multi-layer board. The developing board is then passed to a measuring station 36 wherein one or more of preselected hole positions are sensed, for example, using a light or x-ray or other source 38 and receptors 40 (FIG. 4) which determine the actual position(s) of the selected holes.

Measurements of hole positions taken at measuring station 36 are then fed to a computer driven imager at imaging station 30 which "distorts" or adjusts the computer generated image to accommodate for variations of through-hole positions based on the actual observed position of the holes using digital imaging or conformal mapping techniques to image the next board or series of board layers, e.g., in accordance with the teachings of U.S. Pat. Nos. 4,639,868, 4,815,000 and 5,005,135, the teachings of which patents are incorporated herein by reference.

The next imaged board layer or layers is/are then passed to processing station 32 where the circuits, etc. are formed as before, and the next processed board layers is/are then passed to drilling station 34, where the individual board layers are drilled as before. The resulting drilled boards are then passed to stacking and lamination station 42, wherein the board layers are stacked and laminated in alignment on the developing board. Hole position measurements are taken as before, and the new hole position measurements are fed to the computer driven imager at imaging station 30 where new adjustments are made in the artwork to accommodate variations in the hole positions. The process is repeated until the desired number of layers is achieved.

Finally, the through-holes are dressed out at a drilling station 44 to conform substantially to the through-holes predetermined design position and size. Inasmuch as only a small amount of material needs to be removed in dressing out the through-holes at drilling station 44, the problems of drill bit overheating, excessive wear and breakage, and drill smear, present in conventional multi-layer drilling operations are avoided. Also, since hole misregistration is essentially eliminated, board loss due to drilling error also essentially is eliminated.

Separately drilling the individual board layers in accordance with the present invention also permits drilling within the aspect ratio of the drill bits, thus substantially reducing drilling problems of drill bit overheating, drill bit excessive wear and breakage, machine downtime and drill bit costs of conventional multi-layer drilling systems, as well as board loss or rework costs resulting from worn or broken drill bits and drill smear. Thus, even though more individual drilling operations and board handling may be required, the overall cost of separately drilling each board is less than drilling a stack of boards when down-time and board loss is figured in.

While the above description provides a full and complete disclosure of the preferred embodiment of the invention, various modifications may be made without departing from the spirit and scope of the invention. For example, while it is preferred to separately drill the individual board layers, two or three board layers may be clamped together and drilled simultaneously in accordance with the teachings of the present invention. Also, the invention also may advantageously be employed to produce buried vias in a multi-layer board.

Still other modifications will be apparent to one skilled in the art. For example, the process of the present invention also advantageously may be used to correct artwork to compensate for lamination distortion based on examination, for example, of alignment marks using lights or x-rays. Similarly, the process of the present invention may be used to measure the effects of lamination distortion in advance using test artwork such as patterns of fiducial marks (rather than the actual board artwork). Thus, by deriving a model for the lamination error introduced into, for example, a 6×12 board of a particular thickness and material, it should not be necessary (other than for spot quality control checks) to measure the lamination effects in a specific 6×12 board of similar thickness and material, even if the artwork is different. In other words, using the process of the present invention, it is possible to use the measurements from one "master" 6×12 board to alter the artwork of all subsequent 6×12 boards, even if the subsequent boards have different artwork. Another possible test pattern would be to fabricate a through-hole that only connects to one layer of the board. In other words, only one layer has the "hole surround" copper area. This would make it possible to distinguish the offset of one particular layer from the offset of the other layers allowing for correction of lamination distortion that varies in severity by board layer.

What is claimed is:

1. A method of ensuring via or hole registration in a multi-layer printed circuit board comprising the steps in sequence of:
    (a) forming and drilling at least one hole in a first board layer in at least one preselected position;
    (b) illuminating at least a portion of a surface of said first board layer with light;
    (c) detecting light passing through said at least one hole in said first board layer and determining the actual position of said at least one hole;
    (d) generating in a computer a computer image representative of said first board layer having said at least one hole in said actual position; and,
    (e) automatically adjusting said preselected position, by conformal mapping digital imaging techniques in said computer, so that said preselected position conforms to said actual position and using said adjusted preselected position to permit automatic formation and drilling of a next board layer without using a physical template.

2. A method according to claim 1, wherein said light is detected by means of a light receptor means.

3. A method according to claim 1, wherein said through-holes are undersized, and including the steps of stacking and laminating said board layers, and reaming said holes to finish size.

4. A method according to claim 1, wherein said light comprises visible light.

5. A method according to claim 1, wherein said light comprises x-radiation.

6. A method for forming at least one via or hole in a multi-layer printed circuit board, said multi-layer board including a plurality of separate circuit board layers, comprising the steps of:
    (a) forming holes in each of said plurality of separate board layers according to the method of claim 1; and
    (b) stacking and laminating said separate board layers to form a multi-layer board.

7. A method according to claim 6, wherein said holes formed in said separate board layers are undersized, and including the step of dressing out said holes to finish size following said stacking and laminating.

8. A method of correcting for the effects of lamination distortion in the production of a multi-layer printed circuit board comprising the steps in sequence, of:
    (a) forming a first board layer having at least one fiducial mark in a preselected position;
    (b) subjecting said first board layer to laminating conditions;
    (c) illuminating at least a portion of a surface of said first board layer with light;
    (d) detecting light passing through or reflected from the illuminated surface of said first board and determining the actual position of said at least one fiducial mark; generating in a computer a computer image representative of said first board layer having said at least one mark in said actual position and determining any distortion to said first board layer that has occurred as a result of said laminating conditions; and
    (e) automatically adjusting formation of a next board layer by conforming said preselected position to said actual position by using conformal mapping techniques and accounting for said distortion, without using a physical template.

9. A method according to claim 8, wherein said light is detected by means of a light receptor means.

10. A method according to claim 8, wherein said light comprises visible light.

11. A method according to claim 8, wherein said light comprises x-radiation.

* * * * *